United States Patent
Nagatomo

(10) Patent No.: US 12,388,412 B2
(45) Date of Patent: Aug. 12, 2025

(54) ACOUSTIC WAVE DEVICE

(71) Applicant: Murata Manufacturing Co., Ltd., Nagaokakyo (JP)

(72) Inventor: Shou Nagatomo, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 977 days.

(21) Appl. No.: 17/492,753

(22) Filed: Oct. 4, 2021

(65) Prior Publication Data
US 2022/0029601 A1    Jan. 27, 2022

Related U.S. Application Data

(63) Continuation of application No. PCT/JP2020/016115, filed on Apr. 10, 2020.

(30) Foreign Application Priority Data

Apr. 12, 2019   (JP) .................................. 2019-076446

(51) Int. Cl.
| | | |
|---|---|---|
| H03H 9/02 | (2006.01) | |
| H03H 9/145 | (2006.01) | |
| H03H 9/25 | (2006.01) | |

(52) U.S. Cl.
CPC .... H03H 9/02574 (2013.01); H03H 9/02559 (2013.01); H03H 9/02637 (2013.01);
(Continued)

(58) Field of Classification Search
CPC ........... H03H 9/02637; H03H 9/02574; H03H 9/02992; H03H 9/02866; H03H 9/145; H03H 9/02559; H03H 9/25
See application file for complete search history.

(56) References Cited

U.S. PATENT DOCUMENTS 10,715,105 B2 *  7/2020  Kishimoto ............. H03H 9/175
10,938,371 B2 *  3/2021  Nakamura ......... H03H 9/02858
(Continued)

FOREIGN PATENT DOCUMENTS

JP    2013-518455 A    5/2013
JP    2013-544041 A    12/2013
(Continued)

OTHER PUBLICATIONS

Official Communication issued in International Patent Application No. PCT/JP2020/016115, mailed on Jun. 30, 2020.

*Primary Examiner* — J. San Martin
(74) *Attorney, Agent, or Firm* — Keating & Bennett, LLP

(57) ABSTRACT

An acoustic wave device includes a piezoelectric film stacked directly on or indirectly above a support substrate; and an IDT electrode on the piezoelectric film and including an intersecting region in which first and second electrode fingers overlap with each other in an acoustic wave propagation direction, the intersecting region includes a central region in a direction in which the first and second electrode fingers extend and first and second edge regions on sides outside the central region, acoustic velocities in the first and second edge regions are lower than an acoustic velocity in the central region, a thickness Ht in the central region is different from thicknesses He in the first and second edge regions, and at least either of Ht and He is not more than about 1λ, where λ is a wavelength which is determined by an electrode finger pitch of the IDT electrode.

20 Claims, 7 Drawing Sheets

(52) U.S. Cl.
CPC .... *H03H 9/02866* (2013.01); *H03H 9/02992* (2013.01); *H03H 9/145* (2013.01); *H03H 9/25* (2013.01)

(56) References Cited

U.S. PATENT DOCUMENTS

| | | | |
|---|---|---|---|
| 11,689,179 B2* | 6/2023 | Tabrizian | H03H 9/02007 |
| | | | 181/175 |
| 2013/0051588 A1 | 2/2013 | Ruile et al. | |
| 2013/0249647 A1 | 9/2013 | Nakanishi et al. | |
| 2014/0001919 A1* | 1/2014 | Komatsu | H03H 9/02818 |
| | | | 310/313 B |
| 2015/0280689 A1* | 10/2015 | Nakamura | H03H 9/02834 |
| | | | 333/195 |
| 2017/0358730 A1 | 12/2017 | Kishimoto et al. | |
| 2018/0212581 A1 | 7/2018 | Matsumoto | |
| 2019/0334499 A1* | 10/2019 | Koyanagi | H03H 9/02834 |
| 2019/0334500 A1 | 10/2019 | Horikawa | |
| 2019/0386638 A1 | 12/2019 | Kimura et al. | |
| 2020/0036357 A1* | 1/2020 | Mimura | H03H 7/0161 |

FOREIGN PATENT DOCUMENTS

| | | |
|---|---|---|
| JP | 2017-224890 A | 12/2017 |
| WO | 2017/086004 A1 | 5/2017 |
| WO | 2018/131454 A1 | 7/2018 |
| WO | 2018/163860 A1 | 9/2018 |
| WO | 2018/198654 A1 | 11/2018 |

\* cited by examiner

ACOUSTIC WAVE DEVICE

CROSS REFERENCE TO RELATED APPLICATIONS

This application claims the benefit of priority to Japanese Patent Application No. 2019-076446 filed on Apr. 12, 2019 and is a Continuation Application of PCT Application No. PCT/JP2020/016115 filed on Apr. 10, 2020. The entire contents of each application are hereby incorporated herein by reference.

BACKGROUND OF THE INVENTION

1. Field of the Invention

The present invention relates to an acoustic wave device including an edge region having a relatively low acoustic velocity in an intersecting region of an IDT electrode.

2. Description of the Related Art

There has been known an acoustic wave device in which acoustic velocities in some regions are decreased in order to suppress transverse-mode ripples. For example, in an acoustic wave device described in Japanese Unexamined Patent Application Publication No. 2013-518455 below, a low-acoustic-velocity region is provided in an intersecting region, the intersecting region being a region where adjacent electrode fingers overlap as viewed in an acoustic wave propagation direction. That is, first and second edge regions are provided on both sides of a central region of the intersecting region. In each of the first and second edge regions, a decrease in acoustic velocity is achieved by an increase in a width of an electrode finger or stacking a mass addition layer on an electrode finger.

Since a partial increase in a width of an electrode finger or the addition of a mass addition layer is needed in an acoustic wave device as described in Japanese Unexamined Patent Application Publication No. 2013-518455, an electromechanical coupling coefficient and Q characteristics may degrade.

SUMMARY OF THE INVENTION

Preferred embodiments of the present invention provide acoustic wave devices that are each unlikely to suffer degradation of an electromechanical coupling coefficient and degradation of Q characteristics.

An acoustic wave device according to a preferred embodiment of the present invention includes a support substrate, a piezoelectric film stacked directly on or indirectly above the support substrate, and an IDT electrode above the piezoelectric film. The IDT electrode includes a first electrode finger and a second electrode finger which are interdigitated with each other. An intersecting region is a region in which the first electrode finger and the second electrode finger overlap with each other as viewed in an acoustic wave propagation direction, the intersecting region includes a central region at a center in a direction in which the first and second electrode fingers extend, and first and second edge regions on sides outside the central region in the direction in which the first and second electrode fingers extend. Acoustic velocities of acoustic waves in the first and second edge regions are lower than an acoustic velocity of an acoustic wave in the central region. A thickness Ht of the piezoelectric film in the central region is different from thicknesses He of the piezoelectric film in the first and second edge regions. At least either of the thickness Ht of the piezoelectric film in the central region and the thicknesses He of the piezoelectric film in the first and second edge regions is not more than about 1$\lambda$, where $\lambda$ is a wavelength which is determined by an electrode finger pitch of the IDT electrode.

According to preferred embodiments of the present invention, acoustic wave devices that are each unlikely to suffer degradation of an electromechanical coupling coefficient and Q characteristics are provided.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

The present invention will be clearly explained below with reference to the drawings by describing preferred embodiments of the present invention.

Note that the preferred embodiments described in the present specification are illustrative and that a configuration can be partially replaced or combined with another configuration between different preferred embodiments.

Figure 1:
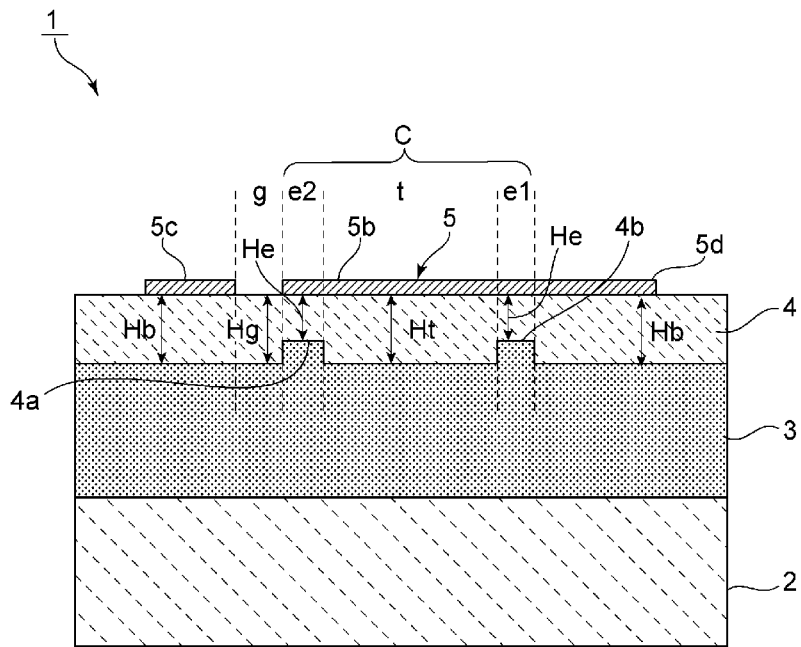
FIG. 1 is a side sectional view of an acoustic wave device according to a first preferred embodiment of the present invention.
Figure 2:
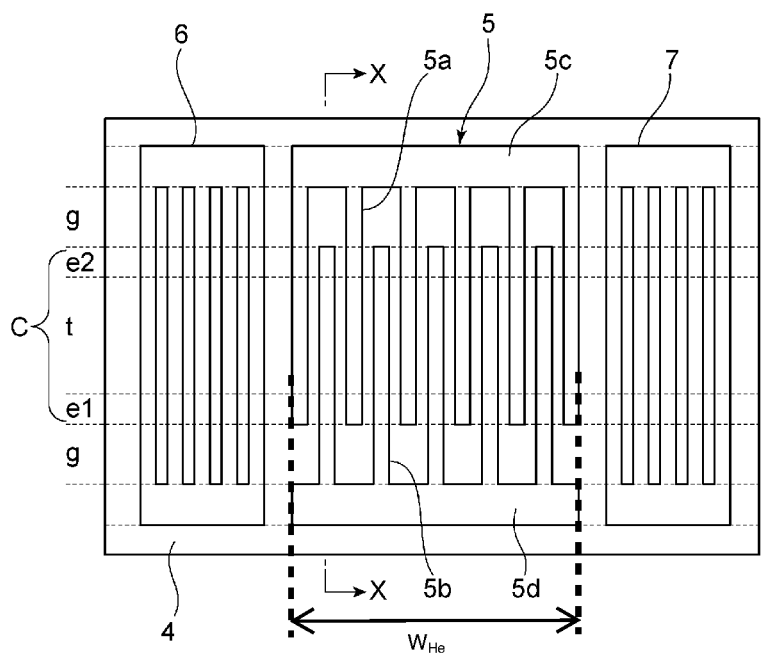
FIG. 2 is a plan view of the acoustic wave device according to the first preferred embodiment of the present invention.

FIG. 1 is a side sectional view of an acoustic wave device according to a first preferred embodiment of the present invention, and FIG. 2 is a plan view of the acoustic wave device. Note that FIG. 1 is a sectional view of a portion along line X-X in FIG. 2.

An acoustic wave device 1 includes a support substrate 2. A piezoelectric film 4 is stacked above the support substrate 2 with an intermediate layer 3 interposed therebetween. An IDT electrode 5 and reflectors 6 and 7 are provided on the piezoelectric film 4. The components define a one-port acoustic wave resonator.

The piezoelectric film 4 is made of lithium tantalate (LiTaO$_3$), for example. The piezoelectric film 4 may be made of another piezoelectric material, such as lithium niobate (LiNbO$_3$), for example. Although the piezoelectric film 4 is stacked indirectly above the support substrate 2 with the intermediate layer 3 interposed therebetween, the piezoelectric film 4 may be stacked directly on the support substrate 2. In the acoustic wave device 1, a portion having a different thickness from other portions is provided in the piezoelectric film 4, thus decreasing an acoustic velocity. This will be described below in more detail.

As shown in FIG. 2, the IDT electrode 5 includes a plurality of first electrode fingers 5a and a plurality of second electrode fingers 5b. The plurality of first electrode fingers 5a and the plurality of second electrode fingers 5b are interdigitated with each other. One ends of the plurality of first electrode fingers 5a are connected to a first busbar 5c. The other ends of the plurality of first electrode fingers 5a are extended toward a second busbar 5d. One ends of the plurality of second electrode fingers 5b are connected to the second busbar 5d. The other ends of the plurality of second electrode fingers 5b are extended toward the first busbar 5c.

An acoustic wave propagation direction is a direction orthogonal or substantially orthogonal to the first and second electrode fingers 5a and 5b. A region where the first electrode fingers 5a and the second electrode fingers 5b overlap with each other as viewed in the acoustic wave propagation direction is an intersecting region C, that is, a region where acoustic waves are excited.

The intersecting region C includes a central region t which is located at a center in a direction in which the first and second electrode fingers 5a and 5b extend and first and second edge regions e1 and e2 which are continuous with outer side portions of the central region t.

Meanwhile, a portion between distal ends of the first electrode fingers 5a and the second busbar 5d is a gap region g shown in FIG. 2. A portion between distal ends of the second electrode fingers 5b and the first busbar 5c is also a gap region g.

As shown in FIG. 1, Ht is a thickness of the piezoelectric film 4 in the central region t, and He is thicknesses of the piezoelectric film 4 in the first and second edge regions e1 and e2. The thickness of the piezoelectric film 4 in the first edge region e1 and the thickness of the piezoelectric film 4 in the second edge region e2 are equal or substantially equal to each other. As shown in FIG. 2, W$_{He}$ is a width of the first and second edge regions e1 and e2 of the intersecting region C.

The acoustic wave device 1 is set such that He<Ht is satisfied. Hg is thicknesses of the piezoelectric film 4 in the gap regions g, and Hb is thicknesses of the piezoelectric film 4 underneath portions where the first and second busbars 5c and 5d are provided. In the present preferred embodiment, Ht=Hg=Hb>He is satisfied.

The support substrate 2 is a silicon substrate, for example. As a material for the support substrate 2, a dielectric or a semiconductor may be used, and the material is not particularly limited. For example, quartz, sapphire, or the like may be used.

The intermediate layer 3 is preferably a low-acoustic-velocity film, for example. The low-acoustic-velocity film refers to a film in which an acoustic velocity of a propagating bulk wave is lower than an acoustic velocity of a bulk wave propagating through the piezoelectric film 4. As a material for the low-acoustic-velocity film, for example, silicon oxide, fluorine-doped silicon oxide, silicon oxynitride, carbon-doped oxide, or the like may be used. In the present preferred embodiment, the intermediate layer 3 is a silicon oxide (SiO$_2$) film, for example.

In the piezoelectric film 4, recessed portions 4b and 4a are provided in a lower surface of the piezoelectric film 4 in order to decrease the thicknesses of the piezoelectric film 4 in the first and second edge regions e1 and e2. The intermediate layer 3 defined by the silicon oxide film is stacked on the lower surface of the piezoelectric film 4 so as to fill the recessed portions 4a and 4b.

The IDT electrode 5 and the reflectors 6 and 7 are each made of a metal, such as, for example, Al, Cu, Pt, W, or Mo, or an alloy based on these metals. A metal material is not particularly limited. The IDT electrode 5 and the reflectors 6 and 7 may each be a laminated metal film including a plurality of metal films that are stacked.

Since the thicknesses He of the piezoelectric film 4 in the first and second edge regions e1 and e2 are set smaller than the thickness Ht of the piezoelectric film 4 in the central region t in the acoustic wave device 1, acoustic velocities in the first and second edge regions e1 and e2 can be decreased. This will be described with reference to FIG. 3.

Figure 3:
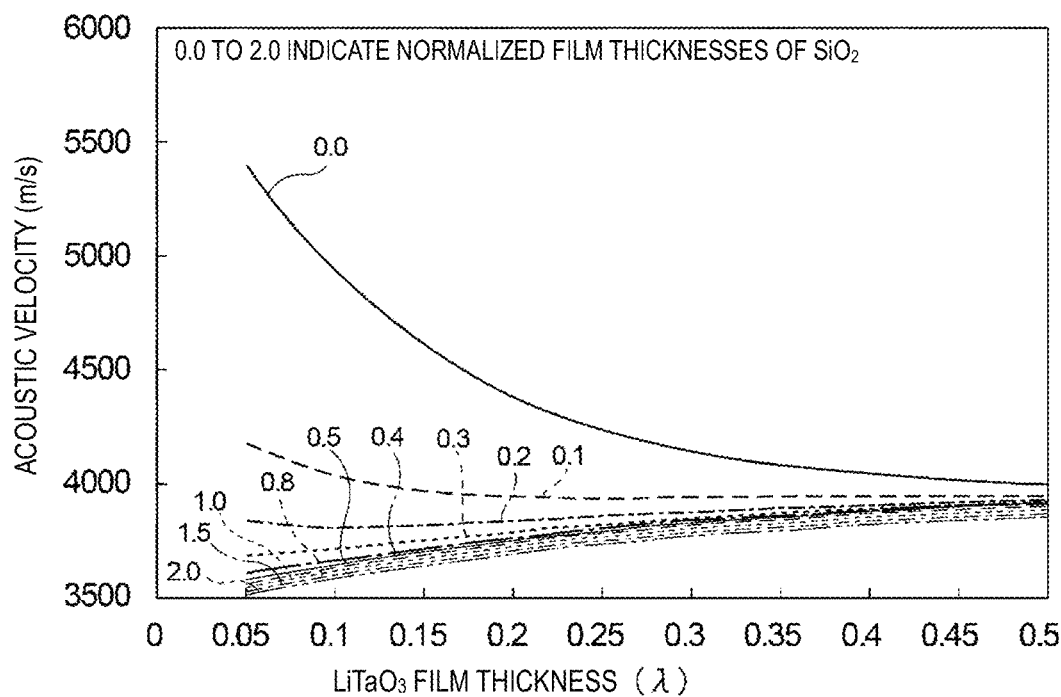
FIG. 3 is a graph showing a relationship among an LiTaO$_3$ film thickness, a normalized film thickness of SiO$_2$, and an acoustic velocity.

FIG. 3 is a graph showing a relationship among an LiTaO$_3$ film thickness, a normalized film thickness of SiO$_2$, and an acoustic velocity. Here, an SiO$_2$ film and an LiTaO$_3$ film are stacked in this order on the support substrate 2. $\lambda$ is a wavelength determined by an electrode finger pitch of the IDT electrode. A film thickness of the LiTaO$_3$ film in FIG. 3 is a value normalized by $\lambda$. Similarly, FIG. 3 shows results of a case where a film thickness of the SiO$_2$ film as a wavelength-normalized film thickness is about 0.1, a case where the film thickness is about 0.2, a case where the film thickness is about 0.3, a case where the film thickness is about 0.4, a case where the film thickness is about 0.5, a case where the film thickness is about 0.8, a case where the film thickness is about 1.0, a case where the film thickness is about 1.5, and a case where the film thickness is about 2.0, and a case where the wavelength-normalized film thickness of the SiO$_2$ film is 0, that is, no SiO$_2$ film is provided.

As can be seen from FIG. 3, in the case where no SiO$_2$ film is provided, an acoustic velocity decreases with an increase in the film thickness of the LiTaO$_3$ film that is a piezoelectric film. This indicates that a thickness of a piezoelectric film is preferably partially increased to provide a low-acoustic-velocity region.

In contrast, it is evident that, in the cases where the film thickness of the SiO$_2$ film is not less than about 0.3$\lambda$, the acoustic velocity increases with an increase in the film thickness of the LiTaO$_3$ film and decreases with a decrease in the film thickness of the LiTaO$_3$ film.

As can be seen from FIG. 3, for example, the acoustic velocity is higher in a case where the film thickness of the LiTaO₃ film is about 0.3λ and the film thickness of the SiO₂ film is about 0.1λ than in a case where the film thickness of the LiTaO₃ film is about 0.1λ and the film thickness of the SiO₂ film is about 0.3λ. That is, if a total film thickness of both of the films is fixed, the acoustic velocity increases with an increase in the film thickness of the LiTaO₃ film. In contrast, it is evident that, in the case where the film thickness of the SiO₂ film is about 0.1λ, the acoustic velocity tends to decrease with an increase in the film thickness of the LiTaO₃ film when the film thickness of the LiTaO₃ film is in the range of about 0.05λ to about 0.2λ inclusive. This indicates that, in a case where an SiO₂ film with a film thickness within the above-described range is selected, there is a range within which the acoustic velocity can be decreased if the sum of the film thicknesses of both of the films is fixed and the film thickness of the LiTaO₃ film is decreased. That is, selection of the film thicknesses of the LiTaO₃ film and the SiO₂ film makes it possible to achieve an increase in acoustic velocity by increasing the film thickness of the LiTaO₃ film and achieve an increase in acoustic velocity by decreasing the film thickness of the LiTaO₃ film.

As shown in FIG. 1, the acoustic wave device 1 is set such that He<Ht is satisfied. Thus, the acoustic velocities in the first and second edge regions e1 and e2 are lower than that in the central region t, and the first and second edge regions e1 and e2 are low-acoustic-velocity regions. Note that, in the acoustic wave device 1, acoustic velocities in the gap regions g are set higher than the acoustic velocities in the first and second edge regions e1 and e2. Acoustic velocities in the portions where the first and second busbars 5c and 5d are provided are lower than those in the gap regions g. In the present preferred embodiment, at least either of the thickness Ht of the piezoelectric film 4 in the central region t and the thicknesses He of the piezoelectric film 4 in the first and second edge regions e1 and e2 is not more than about 1λ, for example.

As described above, the acoustic velocities in the first and second edge regions e1 and e2 are lower than the acoustic velocity in the central region t, and the acoustic velocities in the gap regions g are higher than the acoustic velocities in the first and second edge regions e1 and e2. Thus, the acoustic wave device 1 can reduce or prevent transverse-mode ripples, like the acoustic wave device described in Japanese Unexamined Patent Application Publication No. 2013-518455.

As described above, in the acoustic wave device 1, the recessed portions 4a and 4b are provided in the piezoelectric film 4 in order to decrease the acoustic velocities in the first and second edge regions e1 and e2. Thus, shapes of the first and second electrode fingers 5a and 5b need not be changed in the first and second edge regions e1 and e2. Also, mass addition layers need not be provided on the first and second electrode fingers 5a and 5b. For this reason, degradation of an electromechanical coupling coefficient and degradation of Q characteristics due to a change of a shape of an electrode finger or stacking of a mass addition layer are unlikely to occur.

Note that, for example, the following manufacturing method can be used in order to obtain a structure with decreased thicknesses of the piezoelectric film 4 in the first and second edge regions e1 and e2 although the present invention is not particularly limited thereto.

An LiTaO₃ film is formed to a thickness larger than a thickness of the piezoelectric film 4 on a support base. After that, the LiTaO₃ film is ground and thinned, thus obtaining the piezoelectric film 4. The recessed portions 4a and 4b are then formed by a laser or an appropriate digging method, for example. After that, a silicon oxide film as the intermediate layer 3 is formed so as to fill the recessed portions 4a and 4b of the piezoelectric film 4. Next, the support substrate 2 or a structure with a thin silicon oxide film provided on the support substrate and a multilayer body of the piezoelectric film 4 and the intermediate layer 3 are stacked. After that, the support base is peeled off, and the IDT electrode 5 and the reflectors 6 and 7 are provided.

In the above-described manner, the acoustic wave device 1 can be easily obtained.

Figure 4:
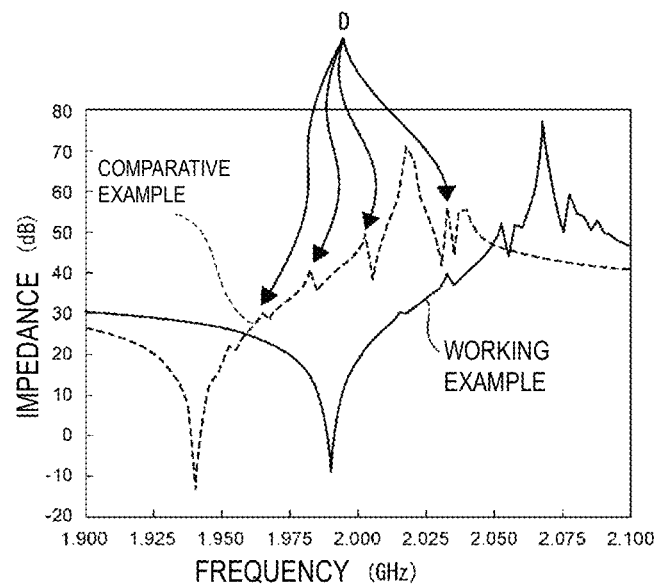
FIG. 4 is a graph showing impedance-frequency characteristics of a working example of an acoustic wave device according to a preferred embodiment of the present invention and a comparative example.

Impedance-frequency characteristics of a working example of an acoustic wave device according to a preferred embodiment of the present invention and a comparative example are shown in FIG. 4. A solid line in FIG. 4 indicates a result of the working example while a broken line indicates a result of the comparative example. In an acoustic wave device as the comparative example, thicknesses He of a piezoelectric film 4 in first and second edge regions e1 and e2 are the same as a thickness Ht of the piezoelectric film 4 in a central region t. Note that design parameters of an acoustic wave device according to a preferred embodiment of the present invention were set as follows.

A support substrate 2: A silicon substrate.

An intermediate layer 3: A silicon oxide film. A thickness of the silicon oxide film in a central region t is about 0.335λ, and thicknesses of the silicon oxide film in first and second edge regions e1 and e2 are about 0.285λ.

A piezoelectric film 4: A 50° Y cut X propagation LiTaO₃ single-quartz film.

A thickness Ht=Hg=Hb is about 0.3λ, and a thickness He is about 0.35λ.

An IDT electrode: The number of pairs of electrode fingers is 100, a wavelength λ determined by an electrode finger pitch is about 2 μm, a configuration of an electrode film is composed of a laminated metal film having a Ti film and an AlCu film in order from the piezoelectric film 4 side, a thickness of the Ti film is about 12 nm, and a thickness of the AlCu film is about 120 nm.

The electrode finger pitch is about 1 μm.

The thickness Ht of the piezoelectric film 4 is about 600 nm=about 0.3λ.

A thickness of the silicon oxide film: about 673 nm=about 0.335λ.

A dimension along a direction in which first and second electrode fingers 5a and 5b extend of a gap region g: about 2λ.

As can be seen from FIG. 4, since acoustic velocities in the edge regions are not decreased in the acoustic wave device as the comparative example, many ripples attributed to transverse modes which are indicated by arrows D appear in a band between a resonant frequency and an anti-resonant frequency and a region higher than the anti-resonant frequency. In contrast, it is evident that ripples as described above are greatly decreased in the working example.

Figure 5:
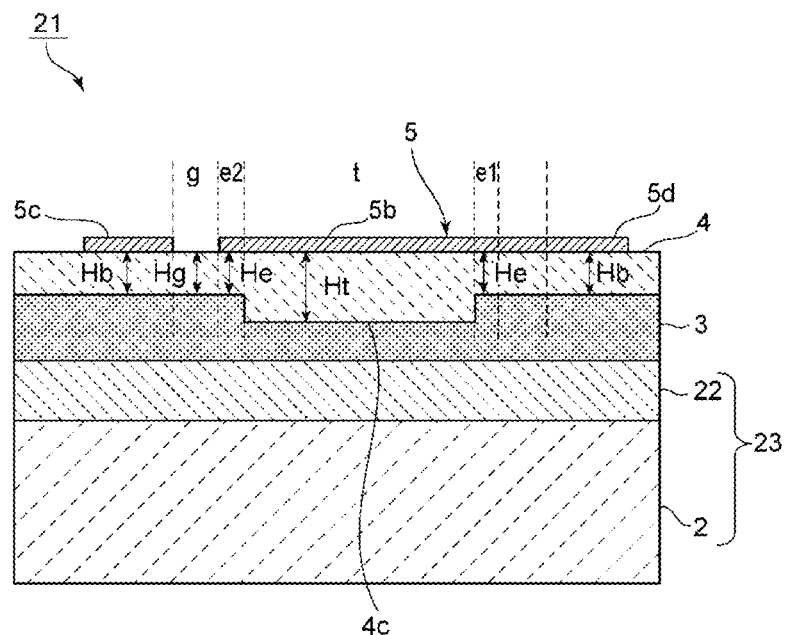
FIG. 5 is a side sectional view of an acoustic wave device according to a second preferred embodiment of the present invention.

FIG. 5 is a side sectional view of an acoustic wave device according to a second preferred embodiment of the present invention. Note that side sections shown in FIG. 5 and FIGS. 6 to 9 and 11 to 14 (to be described below) indicate sections at the same or substantially the same positions as in FIG. 1.

In an acoustic wave device 21 shown in FIG. 5, a protruding portion 4c is provided on a lower surface of a piezoelectric film 4 so as to provide a region having a relatively large thickness. The protruding portion 4c is located immediately below a central region t.

As described above, in the piezoelectric film 4, the protruding portion 4c may be provided to provide a region having a different thickness in an intersecting width direction from the remainder. Note that the intersecting width direction is parallel or substantially parallel to a direction in which first and second electrode fingers 5a and 5b extend. In the present preferred embodiment, an IDT electrode 5 is configured in the same or substantially the same manner as in the first preferred embodiment. The piezoelectric film 4 is an LiTaO$_3$ film, and an intermediate layer 3 is a silicon oxide film, for example. A thickness of the intermediate layer 3 is the same or substantially the same as in the first preferred embodiment. In the present preferred embodiment, thicknesses He of the piezoelectric film 4 in first and second edge regions e1 and e2 are set smaller than a thickness Ht of the piezoelectric film 4 in the central region t. Thus, the first and second edge regions e1 and e2 define low-acoustic-velocity regions. Note that He=Hg=Hb is satisfied. In this case, acoustic velocities in gap regions g are higher than acoustic velocities in the first and second edge regions e1 and e2. It is thus possible to effectively reduce or prevent transverse-mode ripples.

Additionally, in the acoustic wave device 21, a low-acoustic-velocity film 22 as a low-acoustic-velocity layer is stacked between a support substrate 2 and the intermediate layer 3. The support substrate 2 is a silicon substrate, for example. Thus, the support substrate 2 as a high-acoustic-velocity layer and the low-acoustic-velocity film 22 define a confinement layer 23. Here, the low-acoustic-velocity film 22 refers to a film which is made of a low-acoustic-velocity material in which an acoustic velocity of a propagating bulk wave is relatively low. The support substrate 2 is made of a high-acoustic-velocity material. For this reason, the low-acoustic-velocity film 22 and the support substrate 2 define the confinement layer 23. That is, since the high-acoustic-velocity material is located farther from the piezoelectric film 4 than the low-acoustic-velocity material, acoustic waves can be confined on the piezoelectric film 4 side.

The low-acoustic-velocity material and the high-acoustic-velocity material described above are not particularly limited as long as a relative acoustic velocity relationship is established. Preferably, various materials, such as, for example, silicon oxide, glass, silicon oxynitride, tantalum oxide, a compound formed by adding fluorine, carbon, boron, hydrogen, or a silanol group to silicon oxide, and a medium made mainly of the above-described materials, can be used as the low-acoustic-velocity material.

Various materials, such as, for example, aluminum oxide, silicon carbide, silicon nitride, silicon oxynitride, silicon, sapphire, lithium tantalate, lithium niobate, quartz, alumina, zirconia, cordierite, mullite, steatite, forsterite, magnesia, a diamond-like carbon (DLC) film, or diamond, media made mainly of the above-described materials, and media made mainly of mixtures of the above-described materials, can be used as the high-acoustic-velocity material.

The intermediate layer 3 is a silicon oxide film, for example. In this case, a silicon oxide film may also be used for the low-acoustic-velocity film 22.

Figure 6:
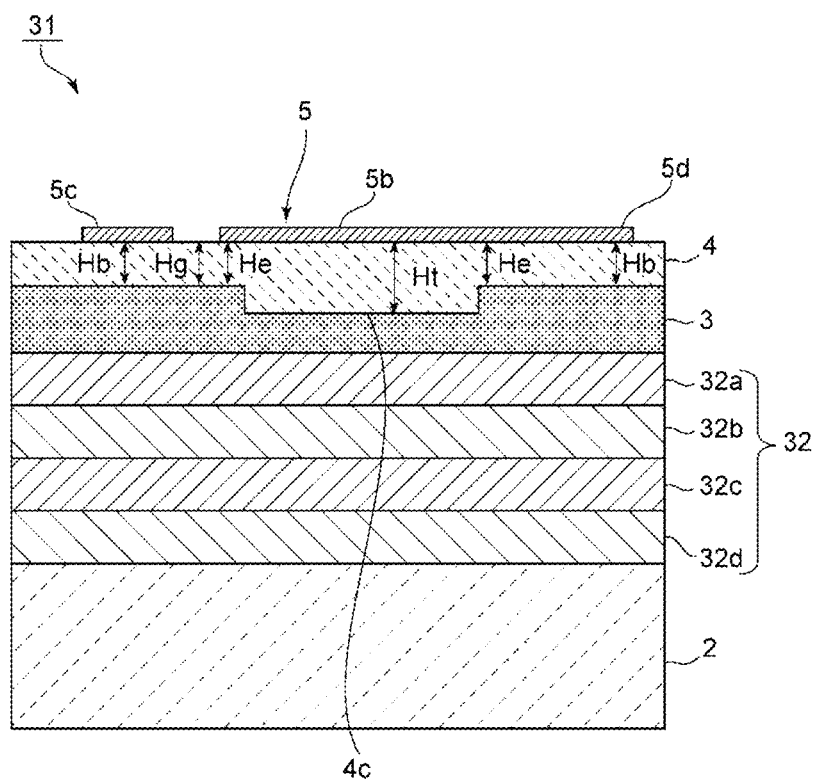
FIG. 6 is a side sectional view of an acoustic wave device according to a third preferred embodiment of the present invention.

FIG. 6 is a side sectional view of an acoustic wave device according to a third preferred embodiment of the present invention. An acoustic wave device 31 is the same or substantially the same as the acoustic wave device 21, except that a support substrate 2 and a confinement layer 32 shown in FIG. 6 are provided instead of the confinement layer 23 in FIG. 5.

The support substrate 2 is a silicon substrate, for example. The confinement layer 32 is stacked between the support substrate 2 and an intermediate layer 3. As described above, the confinement layer 32 may be provided independently of the support substrate 2.

Additionally, the confinement layer 32 is an acoustic Bragg reflector. That is, low-acoustic-impedance layers 32a and 32c having relatively low acoustic impedances and high-acoustic-impedance layers 32b and 32d having relatively high acoustic impedances are alternately stacked. As described above, presence of a structure in which the high-acoustic-impedance layers are stacked farther from the piezoelectric film 4 than the low-acoustic-impedance layers makes it possible to reflect acoustic waves and effectively confine energy of acoustic waves on the piezoelectric film 4 side.

In a preferred embodiment of the present invention, an acoustic Bragg reflector may be used as the confinement layer 32, as described above. In this case, the number of low-acoustic-impedance layers and high-acoustic-impedance layers stacked is not particularly limited.

Figure 7:
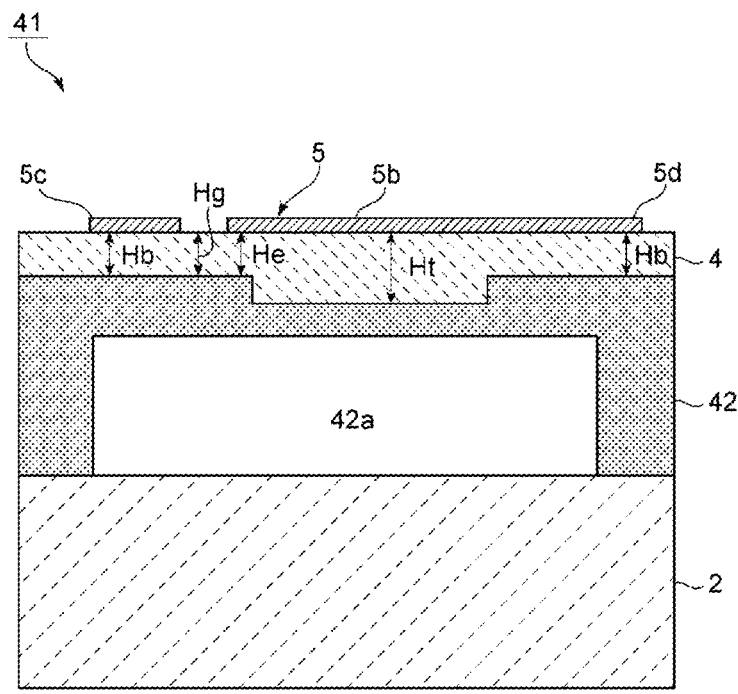
FIG. 7 is a side sectional view of an acoustic wave device according to a fourth preferred embodiment of the present invention.

FIG. 7 is a side sectional view of an acoustic wave device according to a fourth preferred embodiment of the present invention. An acoustic wave device 41 is configured in the same or substantially the same manner as the acoustic wave device 21, except that a confinement layer 42 is provided between a support substrate 2 and a piezoelectric film 4. Here, the confinement layer 42 also defines and functions as the intermediate layer 3 shown in FIG. 5.

The confinement layer 42 is made of silicon oxide, for example. An upper surface of the confinement layer 42 is in contact with a lower surface of the piezoelectric film 4. A cavity 42a is provided in the confinement layer 42. The cavity 42a is provided in a region including a portion below a portion where an intersecting region C as described earlier is located in an IDT electrode 5. This makes it possible to reduce or prevent leakage of acoustic waves to the support substrate 2 side and effectively confine energy of acoustic waves in the piezoelectric film 4. As described above, in a preferred embodiment of the present invention, the confinement layer 42 having the cavity 42a may be used.

Figure 8:
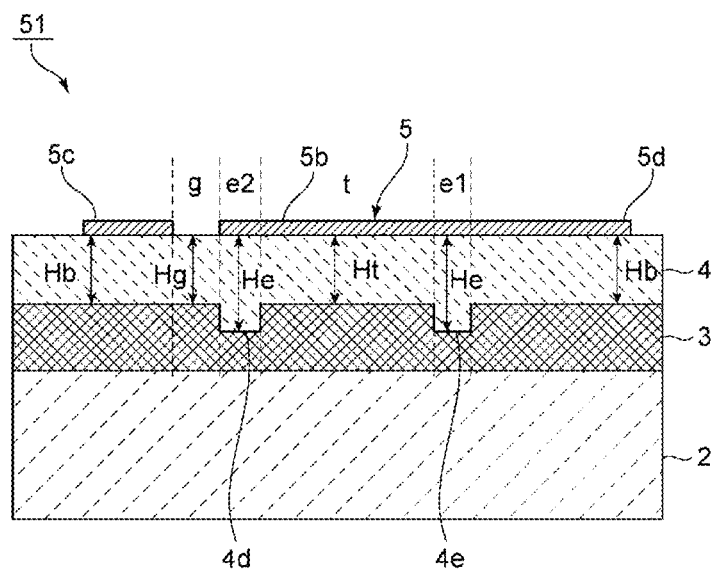
FIG. 8 is a side sectional view of an acoustic wave device according to a fifth preferred embodiment of the present invention.

FIG. 8 is a side sectional view of an acoustic wave device according to a fifth preferred embodiment of the present invention. In an acoustic wave device 51, protruding portions 4d and 4e are provided on a lower surface of a piezoelectric film 4. The protruding portions 4d and 4e are provided in second and first edge regions e2 and e1. That is, the acoustic wave device 51 is set such that He>Ht=Hg=Hb is satisfied. Thus, acoustic velocities in the first and second edge regions e1 and e2 where thicknesses of the piezoelectric film 4 are relatively large are set lower than an acoustic velocity in a central region t. As described above, the thickness of the piezoelectric film 4 in the first and second edge regions e1 and e2 may be increased by selecting a relationship among a film thickness of a silicon oxide film, a film thickness of an LiTaO$_3$ film, and an acoustic velocity, and a decrease in acoustic velocity may be achieved.

The acoustic wave device 51 is the same or substantially the same as the acoustic wave device 1 in other structures.

Figure 9:
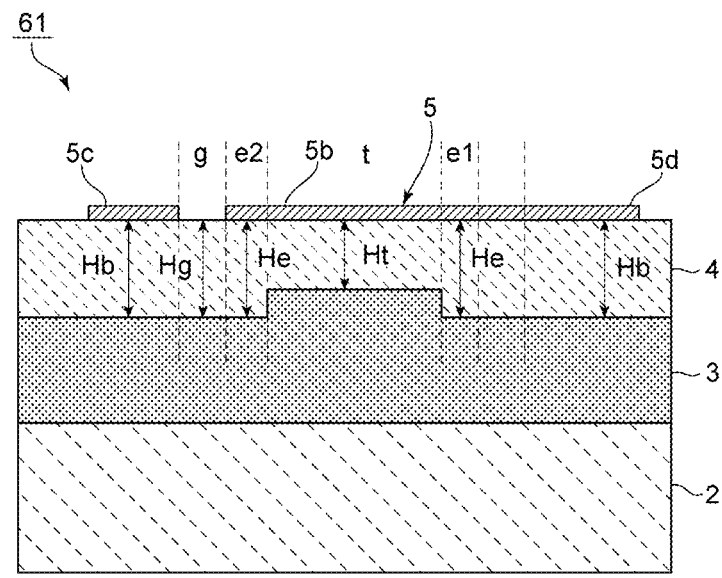
FIG. 9 is a side sectional view of an acoustic wave device according to a sixth preferred embodiment of the present invention.

FIG. 9 is a side sectional view of an acoustic wave device according to a sixth preferred embodiment of the present invention. In an acoustic wave device 61, a recessed portion is provided in a piezoelectric film 4. An intermediate layer 3 is stacked on a lower surface of the piezoelectric film 4 so as to fill the recessed portion. With this configuration, a thickness Ht of the piezoelectric film 4 in a central region t is set smaller than thicknesses He of the piezoelectric film 4 in first and second edge regions e1 and e2. Settings are made such that Ht<He=Hg=Hb is satisfied. Thus, as in the acoustic wave device 51, decreases in acoustic velocity in the first and second edge regions e1 and e2 are achieved by making a thickness of the piezoelectric film 4 relatively larger in the first and second edge regions e1 and e2 than in the central region t.

In the above-described acoustic wave devices 21, 31, 41, 51, and 61, a low-acoustic-velocity region is provided by making the thickness of the piezoelectric film 4 partially different, as in the acoustic wave device 1. Thus, degradation of an electromechanical coupling coefficient and degradation of Q characteristics are unlikely to occur.

Figure 10:
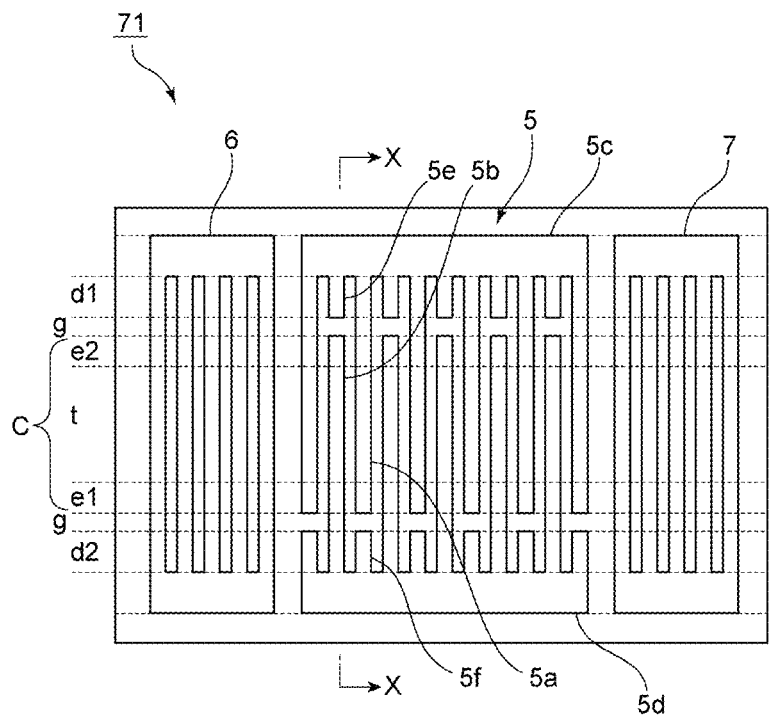
FIG. 10 is a plan view of an acoustic wave device according to a seventh preferred embodiment of the present invention.
Figure 11:
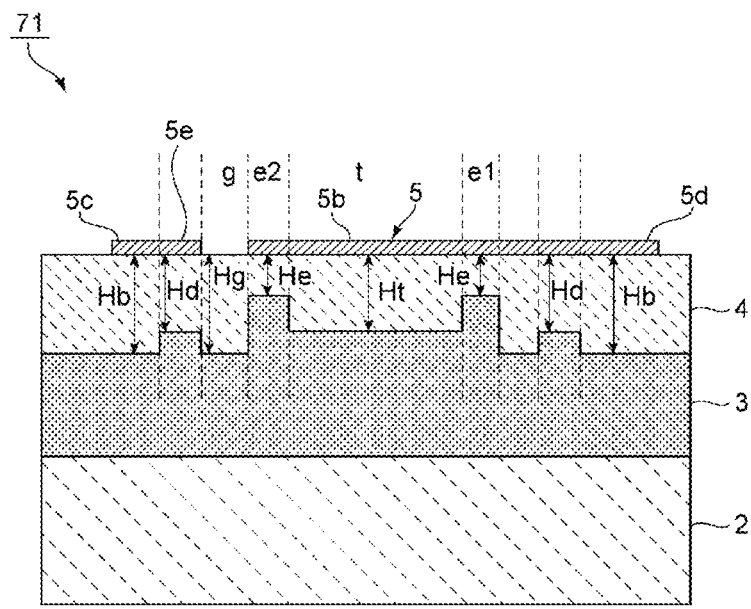
FIG. 11 is a side sectional view of the acoustic wave device according to the seventh preferred embodiment of the present invention.

FIG. 10 is a plan view of an acoustic wave device according to a seventh preferred embodiment of the present invention, and FIG. 11 is a side sectional view of the acoustic wave device. FIG. 11 shows a section of a portion along line X-X in FIG. 10.

In an acoustic wave device 71, an IDT electrode 5 includes first dummy electrodes 5e and second dummy electrodes 5f. In the first dummy electrodes 5e, one ends are connected to a first busbar 5c, and distal ends face distal ends of second electrode fingers 5b across gaps. In the second dummy electrodes 5f, one ends are connected to a second busbar 5d. Distal ends of the second dummy electrodes 5f face distal ends of first electrode fingers 5a across gaps. Such gaps define gap regions g. An electrode structure is the same or substantially the same as in the acoustic wave device 1 according to the first preferred embodiment, except that the first and second dummy electrodes 5e and 5f are provided.

As shown in FIG. 11, the acoustic wave device 71 is set such that He<Ht is satisfied, as in the first preferred embodiment. That is, thicknesses He of a piezoelectric film 4 in first and second edge regions e1 and e2 are smaller than a thickness Ht of the piezoelectric film 4 in a central region t. Thus, acoustic velocities in the first and second edge regions e1 and e2 are set lower than an acoustic velocity in the central region t.

Meanwhile, thicknesses Hg of the piezoelectric film 4 in the gap regions g satisfy Hg>He. Thus, acoustic velocities in the gap regions g are higher than the acoustic velocities in the first and second edge regions e1 and e2.

Note that regions where the first and second dummy electrodes 5e and 5f are provided are referred to as dummy regions d1 and d2. More specifically, regions which overlap with the first and second dummy electrode fingers 5e and 5f as viewed in an acoustic wave propagation direction are the dummy regions d1 and d2. Hd is thicknesses of the piezoelectric film 4 in the dummy regions d1 and d2. The acoustic wave device 71 is set such that Hd<Hg=Hb is satisfied. As described above, effects of transverse-mode ripples can be more effectively reduced or prevented by making settings such that Hd<Hb is satisfied. However, settings need not be made such that Hd<Hb is satisfied.

In the acoustic wave device 71, a support substrate 2 and an intermediate layer 3 are configured in the same or substantially the same manner as in the acoustic wave device 1.

As in the acoustic wave device 71, the IDT electrode 5 may include the first and second dummy electrodes 5e and 5f in the present invention.

Figure 12:
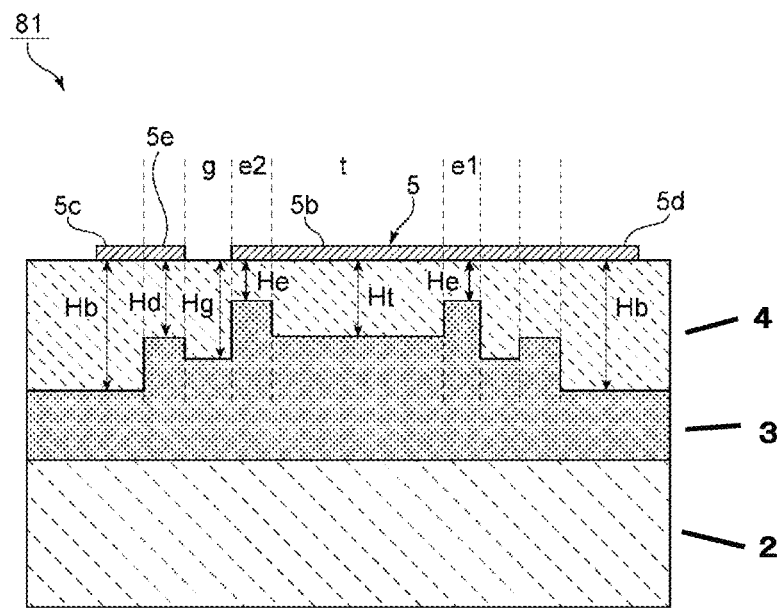
FIG. 12 is a side sectional view of an acoustic wave device according to an eighth preferred embodiment of the present invention.

FIG. 12 is a side sectional view of an acoustic wave device according to an eighth preferred embodiment of the present invention. An acoustic wave device 81 is the same or substantially the same as the acoustic wave device 71, except that portions different in thickness of a piezoelectric film 4 are designed such that He<Ht=Hd<Hg<Hb is satisfied.

In the present preferred embodiment, He<Ht is satisfied, and no electrode material is provided in gap regions g. Thus, acoustic velocities in first and second edge regions e1 and e2 can be made lower than acoustic velocities in an intersecting region C and the gap regions g. Accordingly, ripples due to transverse modes can be effectively reduced or prevented. Additionally, since Hd<Hb is satisfied, ripples due to transverse modes can also be effectively reduced or prevented.

Figure 13:
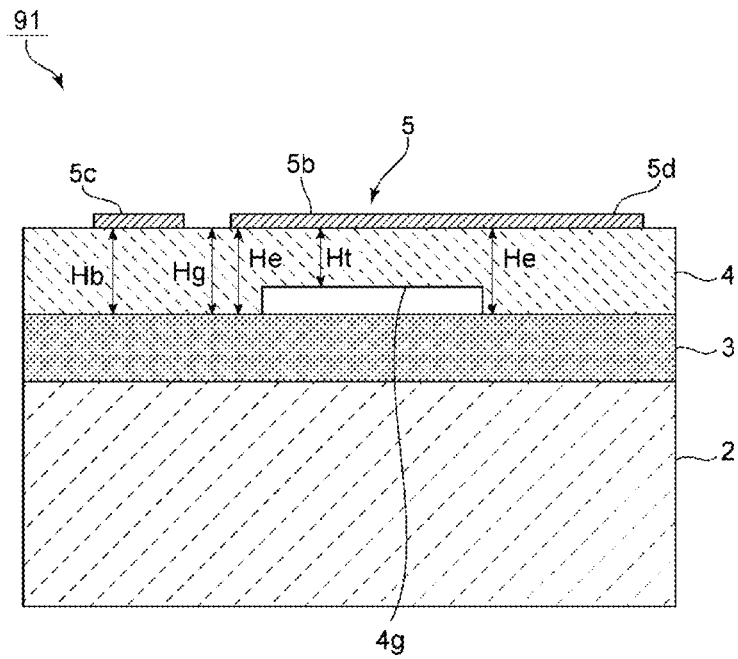
FIG. 13 is a side sectional view of an acoustic wave device according to a ninth preferred embodiment of the present invention.

FIG. 13 is a side sectional view of an acoustic wave device according to a ninth preferred embodiment of the present invention. In an acoustic wave device 91, an intermediate layer 3 including a flat upper surface is stacked on a support substrate 2. A recessed portion 4g is provided in a bottom surface of a piezoelectric film 4. The recessed portion 4g is located underneath a central region t. That is, settings are made such that Ht<He=Hg=Hb is satisfied. As described above, settings are made such that Ht<He is satisfied by providing the recessed portion 4g. A void is provided between a portion where a thickness of the piezoelectric film 4 is relatively small and the intermediate layer 3. The acoustic wave device 91 is the same or substantially the same as the acoustic wave device 51 shown in FIG. 8 in other structures. In the present preferred embodiment, since He>Ht is satisfied, acoustic velocities in first and second edge regions e1 and e2 can be decreased, as in the acoustic wave device 51.

Note that, in terms of manufacturing, a multilayer body of the support substrate 2 and the intermediate layer 3 may be stacked on a lower surface of the piezoelectric film 4 after the recessed portion 4g is formed.

Figure 14:
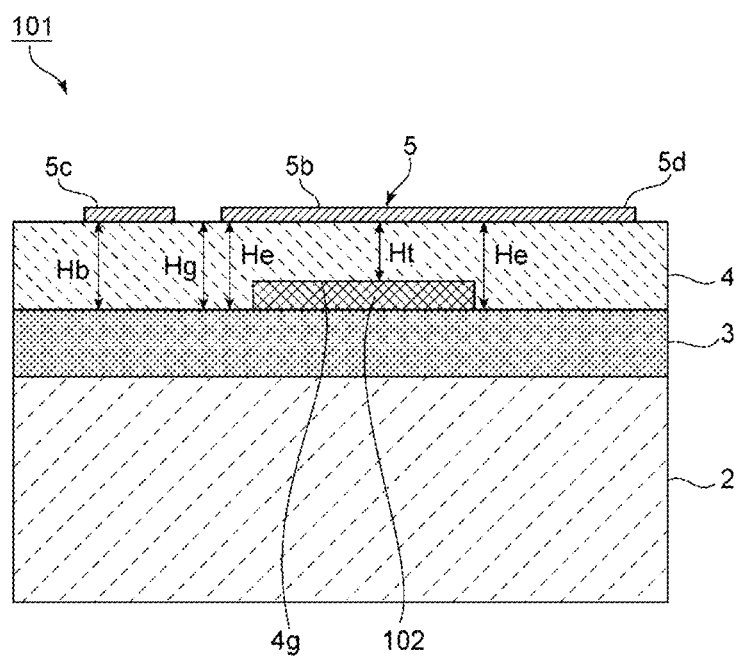
FIG. 14 is a side sectional view of an acoustic wave device according to a tenth preferred embodiment of the present invention.

FIG. 14 is a side sectional view of an acoustic wave device according to a tenth preferred embodiment of the present invention. In an acoustic wave device 101, a recessed portion 4g, that is, a void is filled with a dissimilar-material layer 102 which is made of a material different from that for a piezoelectric film 4. Other components are the same or substantially the same as in the acoustic wave device 91. After the recessed portion 4g is filled with the dissimilar-material layer 102, a silicon oxide film as an intermediate layer 3 may be bonded to a support substrate 2.

A material for the dissimilar-material layer 102 is preferably a material without piezoelectricity. With this configuration, in the same or substantially the same manner as in the acoustic wave device 91, it is easier to make acoustic velocities in first and second edge regions e1 and e2 lower than an acoustic velocity in a central region t.

A material of the dissimilar-material layer 102 is not particularly limited as long as the material is different from that for the piezoelectric film 4. The material is preferably a material without piezoelectricity. As such a material, an insulating material, such as, for example, silicon oxide, silicon oxynitride, or alumina, or a semiconductor material, such as silicon, can be used.

In the acoustic wave devices 91 and 101, degradation of an electromechanical coupling coefficient and degradation of Q characteristics are unlikely to occur, as in the first preferred embodiment.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:
1. An acoustic wave device comprising:
a support substrate;

a piezoelectric film stacked directly on or indirectly above the support substrate; and an IDT electrode above the piezoelectric film; wherein the IDT electrode includes a first electrode finger and a second electrode finger which are interdigitated with each other;

an intersecting region is provided in which the first electrode finger and the second electrode finger overlap with each other as viewed in an acoustic wave propagation direction;

the intersecting region includes a central region at a center in a direction in which the first and second electrode fingers extend, and first and second edge regions on sides outside the central region in the direction in which the first and second electrode fingers extend, and acoustic velocities of acoustic waves in the first and second edge regions are lower than an acoustic velocity of an acoustic wave in the central region;

a thickness Ht of the piezoelectric film in the central region is different from thicknesses He of the piezoelectric film in the first and second edge regions in the piezoelectric film;

at least either of the thickness Ht of the piezoelectric film in the central region and the thicknesses He of the piezoelectric film in the first and second edge regions is not more than about 1λ, where λ is a wavelength determined by an electrode finger pitch of the IDT electrode; and a width in the acoustic wave propagation direction of the thickness He is greater than a width in the acoustic wave propagation direction of at least one of the first electrode finger and the second electrode finger.

2. The acoustic wave device according to claim 1, further comprising:

an intermediate layer between the support substrate and the piezoelectric film; wherein the piezoelectric film is stacked indirectly above the support substrate.

3. The acoustic wave device according to claim 2, wherein the intermediate layer is a silicon oxide film.

4. The acoustic wave device according to claim 3, further comprising a confinement layer between the support substrate and the piezoelectric film to confine energy of an acoustic wave in the piezoelectric film.

5. The acoustic wave device according to claim 2, further comprising a confinement layer between the intermediate layer and the support substrate to confine energy of an acoustic wave in the piezoelectric film.

6. The acoustic wave device according to claim 5, wherein the confinement layer includes a high-acoustic-velocity layer made of a high-acoustic-velocity material in which an acoustic velocity of a propagating bulk wave is higher than an acoustic velocity of an acoustic wave propagating through the piezoelectric film.

7. The acoustic wave device according to claim 5, wherein the confinement layer is an acoustic Bragg reflector including a low-acoustic-impedance layer having a relatively low acoustic impedance and a high-acoustic-impedance layer having a relatively high acoustic impedance.

8. The acoustic wave device according to claim 2, wherein an upper surface of the intermediate layer is in contact with a bottom surface on a side including the intermediate layer of the piezoelectric film, and a void is provided between a portion where a thickness of the piezoelectric film is relatively small and the intermediate layer.

9. The acoustic wave device according to claim 8, wherein the void is filled with a material different from the piezoelectric film.

10. The acoustic wave device according to claim 2, further comprising a confinement layer between the support substrate and the piezoelectric film to confine energy of an acoustic wave in the piezoelectric film.

11. The acoustic wave device according to claim 1, further comprising a confinement layer between the support substrate and the piezoelectric film to confine energy of an acoustic wave in the piezoelectric film.

12. The acoustic wave device according to claim 11, wherein the confinement layer includes a high-acoustic-velocity layer made of a high-acoustic-velocity material in which an acoustic velocity of a propagating bulk wave is higher than an acoustic velocity of an acoustic wave propagating through the piezoelectric film.

13. The acoustic wave device according to claim 12, wherein the confinement layer includes a low-acoustic-velocity layer made of a low-acoustic-velocity material in which an acoustic velocity of a propagating bulk wave is lower than an acoustic velocity of a bulk wave propagating through the piezoelectric film, and the low-acoustic-velocity layer is closer to the piezoelectric film than is the high-acoustic-velocity layer.

14. The acoustic wave device according to claim 11, wherein the confinement layer is an acoustic Bragg reflector including a low-acoustic-impedance layer having a relatively low acoustic impedance and a high-acoustic-impedance layer having a relatively high acoustic impedance.

15. The acoustic wave device according to claim 11, wherein the confinement layer includes a cavity to confine an acoustic wave in the piezoelectric film.

16. The acoustic wave device according to claim 1, wherein the IDT electrode includes first and second busbars, the first electrode finger is connected to the first busbar, the second electrode finger is connected to the second busbar, a space between the first busbar and a distal end of the second electrode finger and a space between the second busbar and a distal end of the first electrode finger are respective gap regions, and thicknesses Hg of the piezoelectric film in the gap regions are equal or substantially equal to the thicknesses He of the piezoelectric film in the first and second edge regions.

17. The acoustic wave device according to claim 16, wherein thicknesses Hb of the piezoelectric film in portions where the first and second busbars are provided are equal or substantially equal to the thicknesses He of the piezoelectric film in the first and second edge regions.

18. The acoustic wave device according to claim 1, wherein the IDT electrode includes first and second busbars, the first electrode finger is connected to the first busbar, the second electrode finger is connected to the second busbar, a space between the first busbar and a distal end of the second electrode finger and a space between the second busbar and a distal end of the first electrode finger are respective gap regions, and thicknesses Hg of the piezoelectric film in the gap regions are different from the thicknesses He of the piezoelectric film in the first and second edge regions and the thickness Ht of the piezoelectric film in the central region.

19. The acoustic wave device according to claim 1, wherein the IDT electrode includes first and second busbars, the first electrode finger is connected to the first busbar, the second electrode finger is connected to the second busbar, a space between the first busbar and a distal end of the second electrode finger and a space between the second busbar and a distal end of the first electrode finger are respective gap regions, and thicknesses Hb of the piezoelectric film in portions where the first and second busbars are provided are different from the thicknesses He of the piezoelectric film in the first and second edge regions and the thickness Ht of the piezoelectric film in the central region.

20. The acoustic wave device according to claim 1, wherein the piezoelectric film is made of lithium tantalate or lithium niobate.

\* \* \* \* \*